United States Patent
Grange (10) Patent No.: US 7,657,238 B2
(45) Date of Patent: Feb. 2, 2010

(54) METHOD AND APPARATUS FOR MODULATING A RADIO SIGNAL USING DIGITAL AMPLITUDE AND PHASE CONTROL SIGNALS

(75) Inventor: Robert Grange, San Diego, CA (US)

(73) Assignee: Nokia Corporation, Espoo (FI)

( * ) Notice: Subject to any disclaimer, the term of this patent is extended or adjusted under 35 U.S.C. 154(b) by 667 days.

(21) Appl. No.: 10/297,847

(22) PCT Filed: Jun. 13, 2001

(86) PCT No.: PCT/EP01/07055

§ 371 (c)(1),
(2), (4) Date: Aug. 4, 2003

(87) PCT Pub. No.: WO01/97479

PCT Pub. Date: Dec. 20, 2001

(65) Prior Publication Data

US 2004/0046607 A1 Mar. 11, 2004

(30) Foreign Application Priority Data

Jun. 13, 2000 (GB) ................. 0014344.6

(51) Int. Cl.
*H01Q 11/12* (2006.01)
*H04B 1/04* (2006.01)
*H04K 1/02* (2006.01)
*H04L 25/03* (2006.01)
*H04L 25/49* (2006.01)
*H04L 27/12* (2006.01)
*H04L 27/04* (2006.01)
*H03C 3/00* (2006.01)
*H03K 7/06* (2006.01)

(52) U.S. Cl. ................. 455/127.1; 455/127.5; 375/297; 375/306; 375/312

(58) Field of Classification Search ............. 455/127.1, 455/127.5; 375/297, 306, 312
See application file for complete search history.

(56) References Cited

U.S. PATENT DOCUMENTS 4,724,396 A * 2/1988 Taylor et al. ................. 330/10

(Continued)

FOREIGN PATENT DOCUMENTS

EP   0 998 088   5/2000

(Continued)

OTHER PUBLICATIONS

Kahn, L., "Single-Sideband Transmission by Envelope Elimination and Restoration," Proc. IRE, Jul. 1952, pp. 803-806.

*Primary Examiner*—Nay A Maung
*Assistant Examiner*—Andrew Wendell
(74) *Attorney, Agent, or Firm*—Banner & Witcoff, Ltd.

(57) ABSTRACT

A transmitter for modulating an RF carrier signal with an input digital data stream is disclosed. The transmitter has a processor for generating digital phase and digital amplitude signals which characterise the input digital data stream, a signal generator for generating an RF carrier signal with a phase property defined by the generated digital phase signal, an amplifier arranged to receive the RF carrier signal as an input, and a bi-level switching circuit responsive to the generated digital amplitude signal to switch between the two levels to generate a voltage signal for supplying power to the amplifier.

20 Claims, 5 Drawing Sheets

U.S. PATENT DOCUMENTS

| | | | | |
|---|---|---|---|---|
| 4,916,599 A | * | 4/1990 | Traxler et al. | 363/65 |
| 5,430,416 A | | 7/1995 | Black et al. | 332/145 |
| 5,977,833 A | * | 11/1999 | Attimont et al. | 330/297 |
| 6,229,289 B1 | * | 5/2001 | Piovaccari et al. | 323/268 |
| 6,282,411 B2 | * | 8/2001 | Higuchi | 455/127.1 |
| 6,294,904 B1 | * | 9/2001 | Hirst | 323/283 |
| 6,366,177 B1 | * | 4/2002 | McCune et al. | 332/103 |
| 6,366,481 B1 | * | 4/2002 | Balakrishnan et al. | 363/21.15 |
| 6,397,090 B1 | * | 5/2002 | Cho | 455/574 |
| 6,449,465 B1 | * | 9/2002 | Gailus et al. | 455/126 |
| 6,605,930 B2 | * | 8/2003 | Hwang | 323/225 |
| 6,721,368 B1 | * | 4/2004 | Kaufman et al. | 375/295 |

FOREIGN PATENT DOCUMENTS

| | | |
|---|---|---|
| EP | 1 035 701 | 9/2000 |
| EP | 1 056 248 | 11/2000 |

* cited by examiner

FIG. 5

METHOD AND APPARATUS FOR MODULATING A RADIO SIGNAL USING DIGITAL AMPLITUDE AND PHASE CONTROL SIGNALS

BACKGROUND OF THE INVENTION

The present invention relates to an amplifier. It is particularly suitable for, but not limited to, use with a power amplifier in a portable radio telephone.

Portable radio telephones operate from an integral battery, and as such have only a finite energy store. Users of portable telephones are increasingly demanding longer operating times from their telephones between re-charging cycles.

Generally, the single largest consumer of energy in a portable telephone is the transmitter, and particularly the power amplifier (PA) stage of the transmitter. Not only does the PA have to operate at relatively higher power levels than the rest of the telephone, it must transmit the required signals while operating in a substantially linear mode of operation to ensure that transmissions conform to the defined standards applicable to the operating mode.

Generally, amplifiers operating in a linear mode are not particularly efficient, and so a compromise must be made between battery life and conformance to the specification. Since the specification must be complied with for a particular telephone to be usable with a particular system, the reduction in battery life necessitated by the amplifier's operating mode is generally accepted.

In prior art portable radio telephones, the transmission path can be notionally divided into several distinct sections. The information to be transmitted is first generated from input speech or data. The digital data created from this process is then modulated at low power to conform to the particular communication standard with which the telephone operates. The analogue Radio Frequency (RF) modulated signal is then boosted in power using a power amplifier, which applies gain to the signal so that it is suitable for transmitting over an air interface using an antenna.

As mentioned, a problem with prior art power amplifiers in portable radio telephones is that they tend to be relatively inefficient. The amplifiers tend to be operated in modes which result in relatively large amounts of the power input to the amplifier being wasted, primarily as heat. This results in shorter battery life and hence shorter talk times than could be otherwise achieved. Other inconveniences may be more frequent re-charging intervals and/or larger batteries.

Efficiency, η, is given by the following formula:

$$\eta = \frac{RF\ Power_{out}}{Power_{in}} \quad (1)$$

A typical figure for η in prior art GSM power amplifiers is in the region of 45%. Therefore, over half of the power input to the amplifier from the battery is wasted, and not converted into the transmitted RF signal.

Aside from the impact such wasted power has on battery life, the heat produced necessitates relatively bulky heat sinks around the PA circuitry to dissipate the unwanted heat. This leads to larger, heavier telephones, unpopular with users.

An ideal power amplifier would have an efficiency, η, of 100% i.e. all the power taken by the amplifier from the power supply would be converted into transmitted RF power, and none would be lost in the form of heat. Ideal amplifiers are of course not possible, but improved PA efficiency is highly desirable.

A known technique which can be used to produce more efficient amplifiers is known as Envelope Elimination and Restoration (EER). This was first disclosed in a paper by L Kahn—"Single Sided Transmission by Envelope Elimination and Restoration"—Proc. IRE, July 1952, pp. 803-806.

The technique is also known as polar modulation, and is described below with reference to FIG. 1 of the accompanying drawings. A low power modulated signal 200 is input to the system 100 at point 110. The modulated signal 200 is both phase modulated (PM) and amplitude modulated (AM). The signal is split using a splitter 120 into two equal components. The first component is applied to detector 130 which outputs a signal corresponding to the envelope 210 of the signal 200. Signal 210 therefore corresponds to the AM information in the signal 200.

The second signal is applied to limiter 140 which outputs a hard limited version 220 of the signal 200. Signal 220 has all the amplitude variation removed from it, and therefore corresponds to the PM information in the signal 200.

The detected signal 210 is applied to amplifier 150, which is used to drive the power supply to the power amplifier 160. In this way, the power amplifier 160 can operate with a constant gain, and the variation in the envelope of the input signal 200 can be recreated by altering the power supply in sympathy with the envelope of input signal 200, as represented by signal 210.

The resultant output signal 230 corresponds to an amplified version of the input signal 200, and is ready for transmission by an antenna (not shown).

To describe the situation mathematically, consider an input signal 200 given by f(t).

The amplitude of f(t) is given by g(t), and the phase of f(t) is given by h(t). Using standard complex notation:

$$f(t) = g(t) \cdot e^{jh(t)} \quad (2)$$

Figure 1:
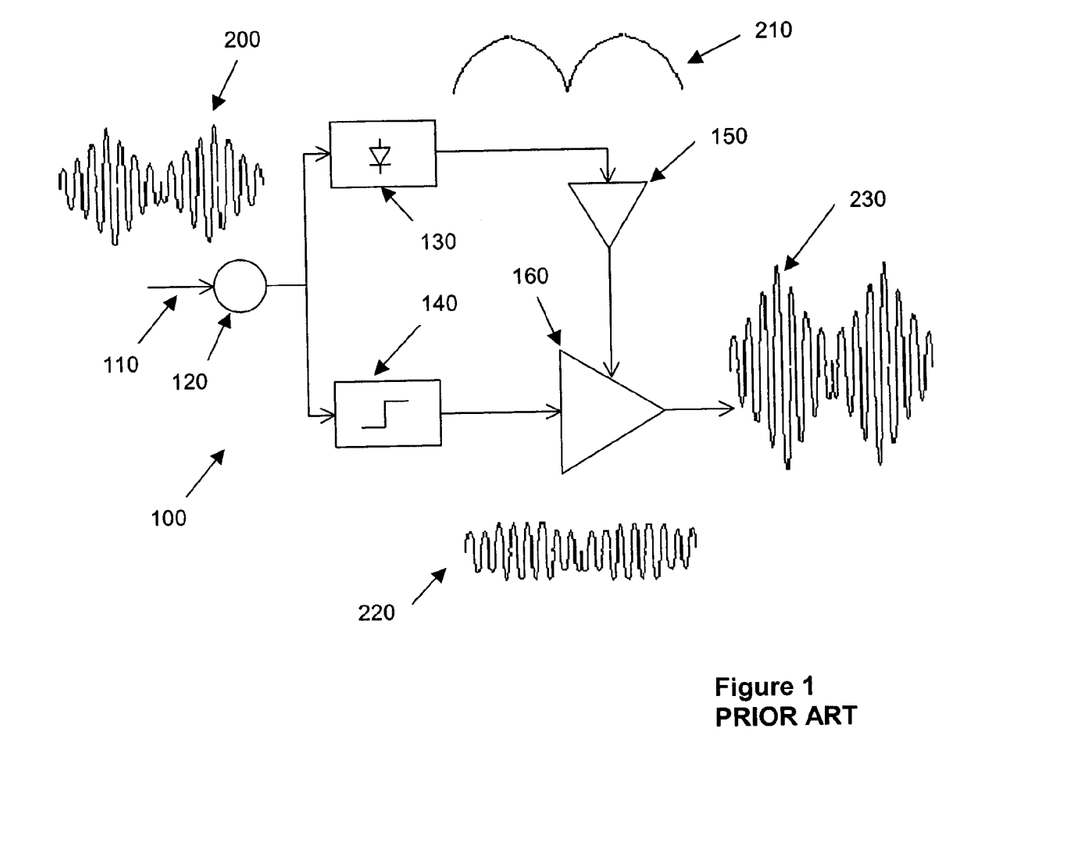
FIG. 1 shows a prior art envelope elimination and restoration technique of modulation.

It can be seen from FIG. 1 that g(t) is represented by signal 210, and that h(t) is represented by signal 220.

The output signal 230 is given by F(t), and is an amplified version of f(t). The amplification is given by G.

$$F(t) = G \cdot f(t) \quad (3)$$

The technique used in the system of FIG. 1 has been known for nearly 40 years, but applying it to devices used in the field of portable telecommunications has proved problematic, primarily due to the frequency of operation of such devices.

SUMMARY OF THE INVENTION

According to a first aspect of the present invention there is provided a transmitter for modulating an RF carrier signal with an input digital data stream, comprising: a processor for generating digital phase and digital amplitude signals which characterise the input digital data stream; a signal generator for generating an RF carrier signal with a phase property defined by the generated digital phase signal; an amplifier arranged to receive the RF carrier signal as an input; and a bi-level switching circuit responsive to the generated digital amplitude signal to switch between the two levels to generate a voltage signal for supplying power to the amplifier.

According to a second aspect of the present invention there is provided a method of operating a transmitter suitable for modulating an RF carrier signal with an input digital data stream, comprising the steps of: generating, from the digital data stream, a digital phase signal and a digital amplitude signal which characterise the digital data stream; generating an RF carrier signal having a phase property defined by the digital phase signal; passing the RF carrier signal to an RF amplifier; causing, in response to the digital amplitude signal, a bi-level switching circuit to switch between the two levels to generate a voltage supply signal; and applying the voltage supply signal to a power supply input of the amplifier.

The switching circuit operates to supply a signal which is switched between two voltage supply rails. There are two possible outputs—each equivalent to a voltage rail. In practice, the values will differ slightly due to internal resistances in the active devices forming the switching circuitry. Such switching offers power efficiency savings.

Advantageously, a transmitter using an amplifier according to embodiments of the invention is able to accept purely digital inputs. The digital inputs need only represent the data to be transmitted in a suitable format for modulation. The modulation process itself occurs in the PA when the phase and amplitude information are effectively re-combined. The ability to operate almost exclusively in the digital domain offers well known advantages in the area of circuit design and layout.

Advantageously, a transmitter according to embodiments of the invention is operable in combination with a wide range of modulation schemes. Different communication standards prescribe different modulation schemes for use by devices operating according to each standard. Embodiments of the invention are able to be used with different modulation schemes due to the manner in which amplitude and phase modulation are achieved.

Devices operating according to the GSM standard use the GMSK modulation scheme. This scheme is known as constant-amplitude as the envelope of the transmitted signal does not alter. The information is encoded in the phase variation of the modulated signal.

Other modulation schemes, such as that used with Wideband CDMA (W-CDMA) produce signals which have time-varying amplitudes as well as phases.

Both these types of modulation, as well as many more, such as EDGE, QPSK and variants thereof, can be generated using embodiments of the invention. Embodiments of the invention may be considered as universal transmitters/modulators, as the exact modulation scheme can be determined in the software which is used to derive the input signals to the transmitter. The hardware of the transmitter itself does not change.

Advantageously, embodiments of the invention do not require the production of In-phase (I) and Quadrature-phase (Q) components to generate the modulated signal. This leads to savings in component count, and a consequential power saving.

Embodiments of the invention preferably utilise a pair of signals to represent the data to be transmitted. The pair of signals includes a signal representing the phase of the data signal, and a signal representing the amplitude of the data signal. In contrast to the prior art system of FIG. 1, the amplitude signal is not a direct representation of the desired resultant envelope of the RF signal. Rather, it is a digitally coded signal which is used to switch an efficient switching amplifier or modulator. The output of the switching amplifier or modulator then provides the voltage supply to an RF power amplifier, which is in turn fed by an RF carrier signal which has been phase modulated in accordance with the digital signal representing the phase of the input signal.

Embodiments of the invention utilise digital data representing the data to be transmitted to control the operation of the PA. Such operation allows the PA to effectively act as a modulator, as this is the first point in the transmit chain where a signal having the phase and amplitude characteristics of the final transmitted signal exists.

Advantageously, embodiments of the invention enjoy substantially higher efficiencies than prior art devices. Improvements of up to 30 or 40 percentage points are possible over prior art devices. Since some prior art devices are only 45% efficient, the available battery life may be nearly double that previously attainable.

For a better understanding of the present invention, and to understand how the same may be brought into effect, the invention will now be described, by way of example only, with reference to the appended drawings in which:

DETAILED DESCRIPTION OF THE INVENTION

In order to provide a complete understanding of the present invention, annexed to this application is a complete copy of the document from which this application claims priority. The annex is to be considered a forming a part of this application.

Figure 2:
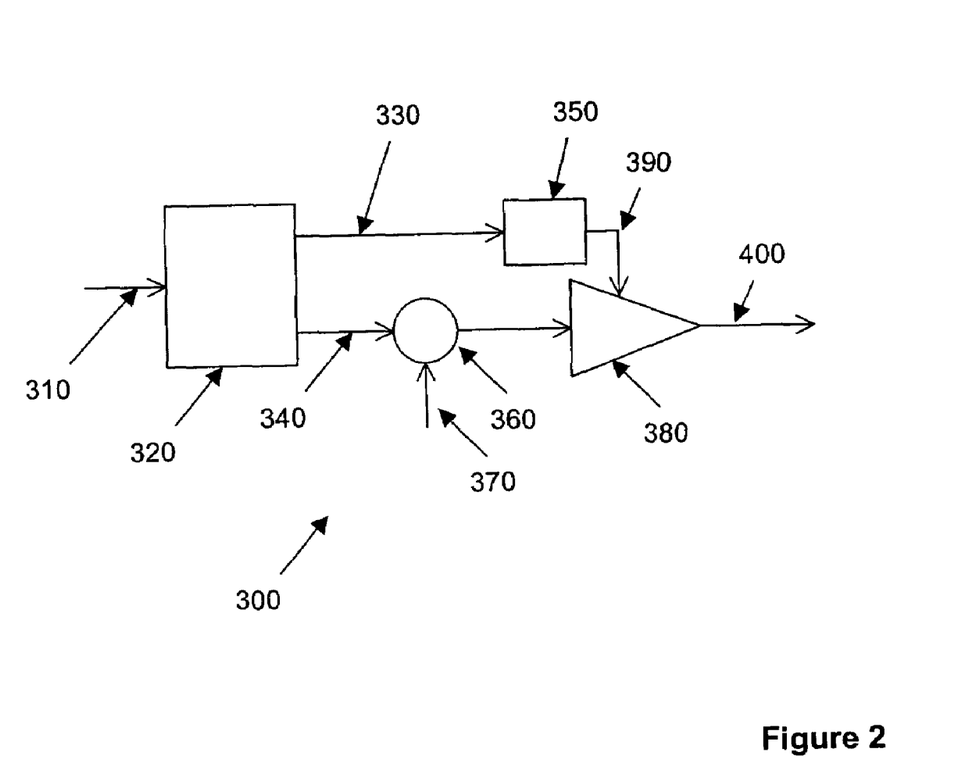
FIG. 2 shows a transmitter according to an embodiment of the invention.

FIG. 2 shows a transmitter 300 according to an embodiment of the invention. The transmitter has an input 310 for receiving a digital data stream representing the data to be transmitted. The data as this point has been coded and formatted as required by the particular communication standard to be used for that transmission. For example, if the transmission is to be according to GSM, then certain coding of the speech will have been performed, the data will have had error-correction and error-detection bits added, and interleaving of the data over successive frames will have been performed. The same raw, e.g. speech, data to be transmitted according to other communication standards will have been processed in a manner required by that particular standard.

The data input at 310 is processed by some form of microprocessor 320 such as a Digital Signal Processor (DSP). The microprocessor 320 produces two output signals. The first signal 330 represents the amplitude of the data to be transmitted. The second signal 340 represents the phase of the data to be transmitted. These two signals can be generated in such a way, by software in the microprocessor, that any modulation scheme relying on phase and/or amplitude modulation can be effected using the transmitter 300. Thus, the transmitter 300 can be considered as a universal transmitter i.e. usable with a wide range of differing communication protocols.

The phase signal 340 is mixed with a signal 370 at the frequency of transmission in mixer 360. The resultant signal forms the input to power amplifier 380. Alternatively, the phase signal 340 can take a different format and can be used to control a frequency synthesiser (not shown) to generate a signal which forms the input to power amplifier 380. In either case, the phase varying component of the resultant signal is derived from the signal 340.

The PA 380 amplifies its input signal to produce RF output signal 400 which is then ready for transmission. In practice, the signal will probably be routed via one or more filters before reaching an antenna.

The amplitude signal 330, derived from the digital input signal 310, is used to generate a voltage supply signal 390 for the PA. This voltage supply signal 390 is made to alter in sympathy with the desired envelope of the RF output signal 400. In this way, the notional gain of the PA remains constant, and the time-varying envelope of the resultant signal is achieved by altering the voltage applied to the PA 380.

The exact relationship between the derived amplitude signal 330 and the digital input signal 310 is determined empirically for each type of modulation supported. In practice, history data, i.e. data occurring prior to a given present time, may be used to generate the digital signal 330.

A perfect digital pulse, i.e. one having perfect edges, in the frequency domain corresponds to a pulse in the time domain having infinite pulse width as the tails of the waveform decay. In order to express such a pulse, the time domain representation must be truncated. The point at which the waveform is truncated can be determined by several factors, such as the processing power available or the size of look up table used to hold history data.

The net effect of truncation is that the current value of data under consideration can only have been derived from a finite number of previous values. For instance, if T is the symbol/bit period, and you decide to truncate at 4T, then the history, i.e. the impact of the previous data bits on the current data bit lasts for 4T. This means that the tails of the waveforms of the previous 3 bits are superimposed onto the current bit, and there are $2^4$ possibilities for each bit.

Effectively, therefore, the digital signal 330 can be calculated from a look up table of history data and knowing the current bit value. Different modulation schemes will each produce a differently structured signal 330.

In a preferred embodiment, the signal 330 takes the form of a pulse width modulated (PWM) signal. Such a signal has a time-varying duty cycle, and can be used to control a switch 350 which supplies power to the power amplifier 380.

Forms of digital signal, other than PWM, can be envisaged for the signal 330 also, PWM being merely exemplary.

A suitable form for the switch 350 may be a switching modulator—a so-called s-class modulator. A switching modulator or amplifier offers efficiency advantages over certain other forms of modulator or amplifier.

Figure 3:
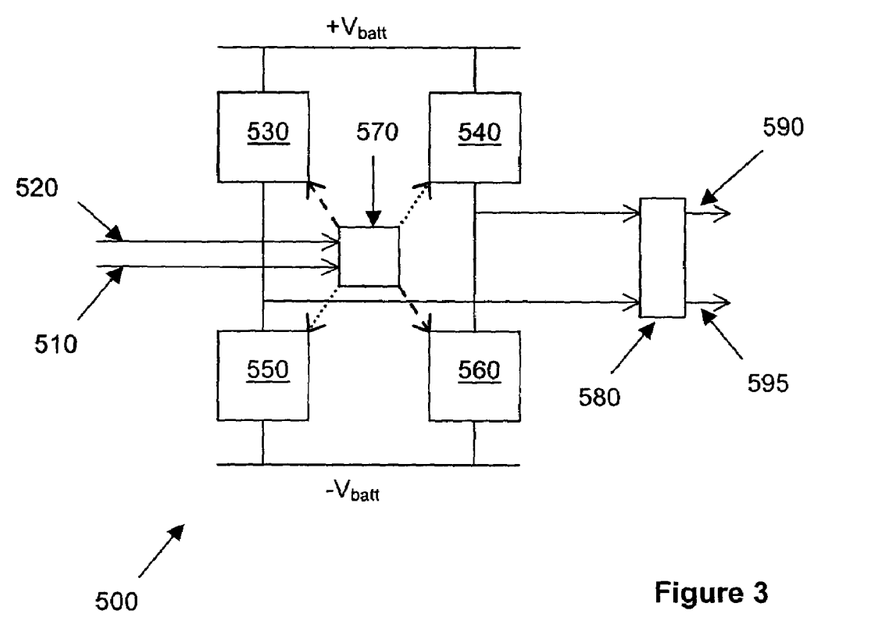
FIG. 3 shows a switching circuit forming part of an embodiment of the invention.

A particularly preferred embodiment uses a form of switching circuit termed an 'H-Bridge' to generate the voltage supply signal 390 to the PA 380.

This arrangement is shown in FIG. 3. The H-Bridge 500 itself comprises 4 switching elements 530, 540, 550, 560, preferably transistors having a low 'on' resistance. Field Effect Transistors (FETs) are particularly suitable for this task.

The transistors are arranged in pairs, and by controlling which pair is on at any given time, it is possible to create a pseudo-digital waveform which varies between two voltage extremes.

Such a scheme requires two control signals 510, 520. It is instructive to consider one of the control signals to be a signal which controls the 'charging' of the PA. The other signal controls the 'discharging' of the PA. By using two signals in this way, as opposed to using a single control signal to switch the PA on and off, it is possible to achieve even greater energy efficiency. This is because the PA is not allowed to decay naturally after it has been 'charged'—such decay wastes energy. Rather, it is forced to 'discharge' by the second control signal, ensuring that energy is not wasted by the decay process. The charging and discharging signals can be understood to be analogous to the accelerator and brake pedal found in cars. The brake ensures that the response does not merely decay, but decelerates as required.

The two control signals 510 and 520, which replace the single control signal 330 of FIG. 2, are received in the H-Bridge 500 by decoder 570. The decoder is operable to generate control signals to switch the pairs of transistors 540 & 550, 530 & 560.

The transistors in each pair are always operated together, as indicated by the control signals emanating from decoder 570. The dotted lines connected to 540 and 550 represent signals which are identical, as do the dashed lines connected to 530 and 560.

The output from switching circuit 350 consists of a square wave signal with stable values at two fixed points—+V and −V (or GND). In the embodiment featuring the H-Bridge, the outputs are similar. Such a switched output signal provides an efficient mode of operation for switching circuit 350 which contributes to the overall power efficiency of the transmitter.

The outputs from the H-Bridge are shown feeding into an envelope reconstruction filter 580. The filter's role is to eliminate sampling noise from the H-Bridge outputs, and output smoothed AM signals 590 and 595 to supply power to the PA's two power rails.

In the H-Bridge embodiment of the invention, signals 590 and 595 replace signal 390 of FIG. 2.

Since the switch 350 is operating in a power efficient mode, maximum impact on the overall efficiency of the transmitter can be achieved by operating the PA 380 in a switched mode also.

Prior art PAs tended to operate in a linear fashion, which, as described, can be very inefficient. Since the amplitude of the signal 400 from the PA is controlled by signal 390, rather than varying the gain of the PA, the PA can be made to operate in a switched mode, resulting in power efficiency gains also.

The RF input to the PA can be allowed overdrive the PA, i.e. allow it to operate in saturated mode, effectively as a switch, safe in the knowledge that the amplitude information which forms part of the encoded signal is impressed upon the final signal 400 by the varying voltage supply 390 which is fed to the PA.

The present invention also provides a high efficiency PA module, integrated with a continuously-variable-power-supply (MEG algorithm), efficiency management system solution.

Problem Solved

Describe the problem or need to solve this invention. Try to identify when the problem or need was originally identified. What led to the problem or need, or how did it develop.

The primary goal is to find a technique, which would enable High Efficiency Power Amplifiers (HEPA) to operate for non-constant envelopes such as wide band code division, multiple access (W-CDMA) and GSM EDGE systems. The power added efficiencies for these modulation schemes have been reported in the 20-percentile range, due to the large amplitude modulation component. This significantly increases battery current consumption which, would decreases talk time of these phones compared to other past generations of digital modulation systems.

One solution, leading to efficiency improvement, is to separate the amplitude and phase components of the IQ modulation and amplify them in two paths. There are several practical methods, which demonstrate the phase path has very high efficiency amplification. Many applications fail to achieve the same efficiency when amplifying the amplitude path. Several proven options are available such as envelope elimination and restoration by Khan and a more modern solution using HBT modulator by Prof. Peter Asbech. Progress has been made and more hardware has been developed such as sigma delta power density modulators. This improves the amplification of the AM path but it is still an energy overhead.

The challenge is to generate the amplitude modulation very efficiently in a wide video bandwidth. The video amplifier efficiency, needed to effectively recover talk time, must be above 80%. Amplifier modulation performance must be very linear and noise free. Normally, linearity and efficiency together are not possible using conventional linear design techniques. The efficiency results from such a linear video amplifier would be in the low 20-percentile range. A large heatsink would be required with this kind of design degrading the requirement to keep the weight down of the hand held phone. Cost would also be increased because of the larger battery required to meet the talk time.

There are other difficulties when combining the phase and amplitude information. First the amplitude data requires delay matching to the phase path or corruption of the data will occur. This is a patent by Conexant by the inventor of the present invention. Secondly the modulation voltage must match the phase path voltage or this will result in over or under modulation magnitude errors. The two paths require characterisation and correction of either phase or amplitude without introducing more cross-coupled errors. Correction of the errors can deplete the efficiency gain and render the improvement in current savings worthless.

Previous Solutions

Describe how others solved the problem before you, so far as you are aware.

List any patents published articles, prior products, etc. that represent these prior efforts at solving the problem that you solved.

Previous systems used very low modulation data rates (kilobits) which allowed a number of simultaneous modulation restoration solutions. Older systems were not so sensitive to talk time as batteries capacity designs were larger. Similar solutions would not work for EDGE or WCDMA due to technological issues with the switching speed of the components. There is no efficiency advantage using linear amplification. All of the older solutions are required to modulate the PA collector or drain DC power supply at supply voltages above 5 volts. The PA needs to be a saturated amplifier to achieve high efficiency in the phase path. Efficiency relies on the Fmax of the RF device and older technologies had Fmax of less than 20 GHz and operated on 5 Volts. The combined efficiency is the product of the saturated PA and the linear modulator and these technologies would have limited the efficiency to a point where the contribution was worthless. Most of the systems were deployed with analogue modulation to achieve better linearity and not regarding efficiency.

Other Solutions

Envelope tracking DC to DC converters, power DAC and class AB push pull video amplifier are some of the methods used to amplify the amplitude signal. A single amplifier could be used with class "A" operation to achieve the lowest distortion. This is the least efficient method to transfer of the amplitude energy to the RF amplifier. Often the envelope tracking was used to make slow corrections to the DC supply only and would be unstable if modulated at the WCDMA chip rate.

Envelope tracking DC to DC converter output adjusting the sense, voltage loop, gain to reproduce the AM low bit rate modulation power. Device Fmax (see note 1) limited control, loop, bandwidth hence the modulation rate cannot be exceed without distortion or stability problems.

Most DC to DC converters are using commercial, industrial, MOS or BPT low frequency switching semiconductor technology. This technology has difficulty in rise time, due to its low transient cut-off frequency.

In some DC to DC tracking converters the efficiency falls as the load current decreases. This is not satisfactory for optimal system efficiency of our modulation restoration technique as there is a power out control specification. Also DC converters may require a large, ferrite, core, inductor to convert the switched energy to envelop power. The ferrite core limits the bandwidth and control word response due to the natural hysteresis and bandpass characteristics of the iron material.

Figure 4:
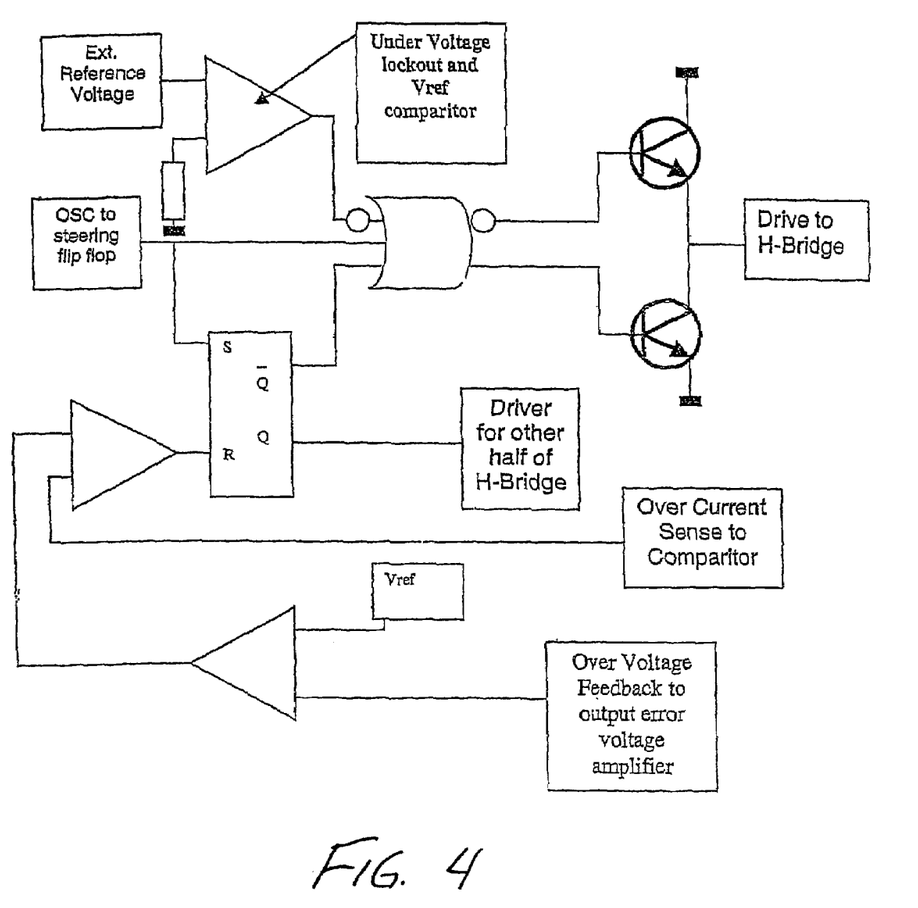
FIG. 4 shows a high efficiency power amplifier according to the present invention.

FIG. 4 shows Amplitude modulation DC to DC tracking RF amplifiers

Power Digital to Analogue Converters (PDAC)

Analog to digital solutions convert energy more efficiently using several pulse formats. The envelope could be converted to pulse-width; pulse-amplitude; pulse-density; pulse-position or a combination of all is also possible. Most of the applications are designed for audio amplifier bandwidths. the final application requires transferring energy directly to the RF amplifier. Final power transfer may require class-AB or class-A amplification after the digital processing. This completes the waveform superposition of phase and amplitude data (waveform restoration).

Sigma Delta DAC Method

The baseband chip generates the initial amplitude signal. This signal is converted to a bipolar stream using any of the above formats. (Pulse density is believed to be the most efficient method). The method simply increases the pulse repetition rate with the envelope peaks and troughs. Polarity, plus or minus, of the pulse determines peaks or trough of the envelope. A DAC capable of transforming the amplitude energy in this format is known as a sigma delta technique. One limitation with this method is the analogue is required to be over sampled by a one bit quantisation process (20 times is typical). This produces out of band switch noise.

Class "A" or "AB" Modulator

This is linear amplification technique and requires very little explanation. It may be a very specialised amplifier design as it is required to work with very wide linear gain and phase bandwidth capable of passing the amplitude modulation product and its harmonic components which, are essential for the restoration process to work. The linear phase and gain bandwidth needs to be at least 3 times the 3.84 Mbit chip rate at high drive currents. This is a very difficult engineering task fraught with compromises.

Solutions

Simultaneous Waveform Restoration

As mention solution utilises a digital simultaneous waveform restoration technique. The energy manager integrated into the PA is used to cancel distortion in the phase path. To this end we need to compare the design with all envelope feed-forward, restoration applications. The main difference is the method the amplitude modulation is generated directly from the BB without conversion of any analogue signals. Energy is handled in such a way that the PA is charged and discharged with an energy management circuit at the chip modulation rate. Two binary streams MEG1 and MEG2 control charging and discharging.

MEG (Modulation Energy Gain) Concept

Baseband computes the amount of energy need by the PA from a matrix and encodes it as a binary stream MEG1. The baseband also computes the energy requires to discharge the PA and is encoded in a second binary stream (MEG-2). The energy management circuit is mounted on the PA package. The MEG binary signals and the energy management solution are equivalent to a continuously variable power supply for the PA at the chip rate. Efficiency is kept constant at all voltage levels of the energy manager circuit during amplitude modulation of the PA.

Figure 5:
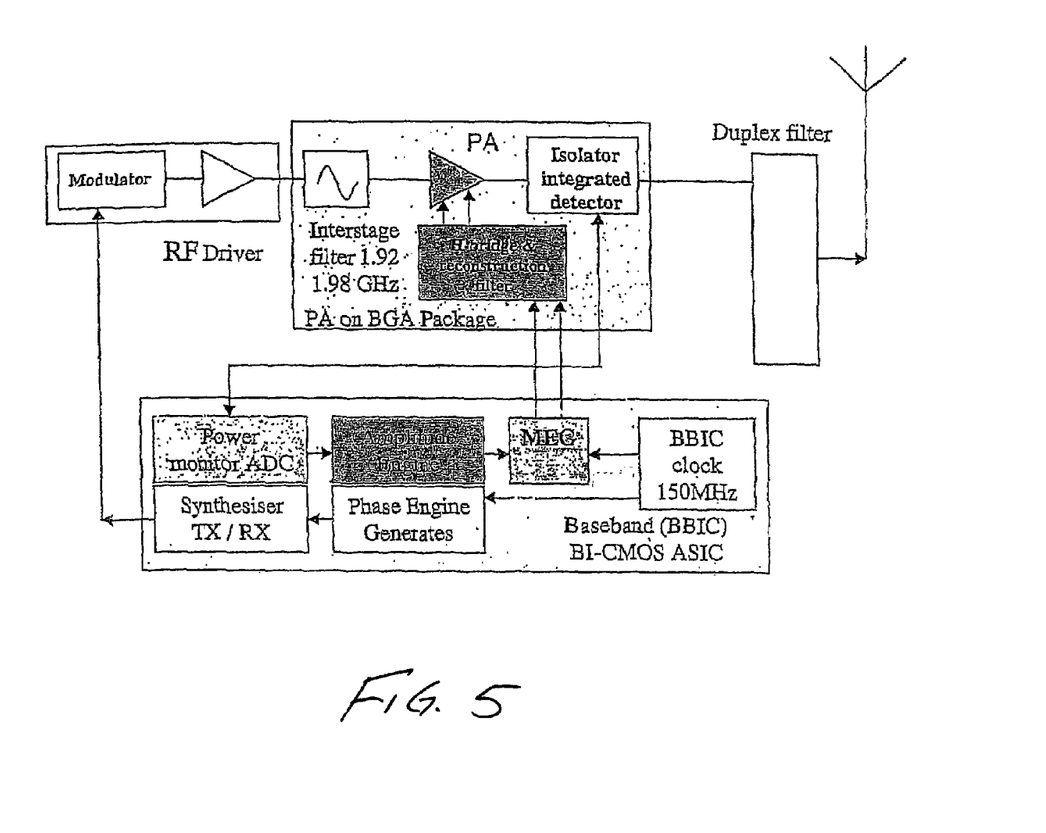
FIG. 5 shows functional blocks in the form of a flow diagram that summarize the functional features of the present invention.

FIG. 5 shows functional blocks that summarize the present invention as a flow diagram.

Saturation PA the Phase Modulated Path

Phase modulated RF power is amplified using the most efficient saturated RF amplifier techniques. This requires the latest RF device technology with at least 40 GHz Fmax. The energy manager is connected to the battery provides the power supply to the PA. A filter between the energy manager and the PA is used as a reconstruction filter for the digital AM signal. When this is applied to the PA, simultaneous waveform restoration technique cancels the broadband spectrum generated by the phase modulation. The combined application of the digital energy manager, MEG and saturated PA results in high efficiency compliant to the air interface specifications. An algorithm solution, adapting the MEG binary code to AM energy in the digital manager, is all that is required to control the RF power output dynamic range. The PA system solution is achieved for all modulation formats by adaptation of the MEG's bit patterns.

1. Differences/Advantages Over Previous Solutions

External sigma delta hardware for the envelope power conversion of the analogue envelope plus a digital decoder driver to the energy manager is eliminated. This would be an extra power overhead. Instead the baseband processor generates two binary control words. The modulation training of the binary streams are done in the baseband to correct for distortion in the phase and amplitude paths.

Integration of the PA with the energy manager eliminates a power dissipative path on the PCB. This reduces 2R dissipation to the PA and filter as they are in the same (package) location. Drive (MEG) to the energy manager is through high impedance lines. This helps to reduce radiation of the MEG signal and interfering with the frequency plan of the phone.

The energy manager and the PA devices are to be manufactured with the same state of the art microwave semiconductor process. Therefore the energy manager transient switching time (Ft=40 GHz) relative to the system modulation rate (4 MHz typical) results in a very high efficiency switch. Normal, energy manager, device, technology uses a low frequency semiconductor process.

The direct generation of the binary MEG codes to the energy manager can be derived closer to the source of modulation generation. I.E. The system does not need to access modulation digital formats of IQ and convert them. DSP power over-heads are reduced and bandwidth is reduced generating the MEG binary format compared to encoding the bipolar power density signal from a Sigma Delta modulation process.

There is also no requirement for a baseband add-on component to convert filtered IQ to the required constant envelope formats. All of this hardware would require energy.

2. Status of Innovation

In parallel our co-simulation platform constructing a behavioural model of a continuously variable power supply in memory. The MEG modulation technique has a specific new algorithm design. Hardware is under construction to demonstrate the technique and train the MEG. An AO is in the process of approval.

3. Product of Program in which Innovation will be Used

It is a very strategic solutions which is destined for EDGE 2 hardware in 2003.

The present invention includes any novel feature or combination of features disclosed herein either explicitly or any generalization thereof irrespective of whether or not it relates to the claimed invention or mitigates any or all of the problems addressed.

What is claimed is:

1. An apparatus, comprising:
    a transmitter for modulating an RF carrier signal with an input digital data stream, the transmitter including
        a processor for generating digital phase and digital amplitude signals which characterise the input digital data stream,
        a signal generator for generating an RF carrier signal with a phase property defined by the generated digital phase signal,
        an amplifier arranged to receive the RF carrier signal as an input, and
        a bi-level switching circuit responsive to the generated digital amplitude signal to switch between a first fixed voltage level and a second fixed voltage level to generate a voltage signal for supplying power to the amplifier.

2. The apparatus of claim 1 wherein the switching circuit is an H-Bridge circuit.

3. The apparatus of any one of the preceding claims wherein the digital amplitude signal comprises a plurality of coded data streams for controlling the switching circuit.

4. The apparatus of claim 3 wherein the plurality of coded data streams includes a first stream for controlling charging of the amplifier and a second stream for controlling discharging of the amplifier.

5. The apparatus of claim 1 wherein the digital amplitude signal is a pulse width modulated (PWM) signal.

6. The apparatus of claim 1 wherein the generated digital amplitude signal comprises amplitude information exclusively.

7. The apparatus of claim 1 wherein the generated digital phase signal comprises phase information exclusively.

8. The apparatus of claim 1 wherein the amplifier is arranged to operate in a switched mode.

9. The apparatus of claim 1 wherein the signal generator is a frequency synthesiser.

10. The apparatus of claim 1 wherein the switching circuit comprises a reconstruction filter at its output.

11. The apparatus of claim 1 wherein the processor for generating digital phase information is a Phase Engine.

12. The apparatus of claim 1 wherein the processor for generating digital amplitude information is an Amplitude Engine.

13. The apparatus of claim 1 wherein the digital amplitude signal is MEG (Modulation Energy Gain) signal.

14. A method, comprising:
    generating from a digital data stream, in a transmitter suitable for modulating an RF carrier signal with the digital data stream, a digital phase signal and a digital amplitude signal which characterise the digital data stream;
    generating an RF carrier signal having a phase property defined by the digital phase signal;
    passing the RF carrier signal to an RF amplifier;
    causing, in response to the digital amplitude signal, a bi-level switching circuit to switch between a first fixed voltage level and a second fixed voltage level to generate a voltage supply signal; and applying the voltage supply signal to a power supply input of the amplifier.

15. The method of claim 14, wherein the bi-level switching circuit is an H Bridge circuit.

16. The method of claim 14, wherein the digital amplitude signal comprises a plurality of coded data streams for controlling the bi-level switching circuit.

17. The method of claim 16, wherein the plurality of coded data streams includes a first stream for controlling charging of the amplifier and a second stream for controlling discharging of the amplifier.

18. The method of claim 14, wherein the amplifier is arranged to operate in a switched mode.

19. An apparatus, comprising:
   a transmitter for modulating an RF carrier signal with an input digital data stream, the transmitter including
      a processor for generating a digital phase signal and a digital amplitude signal which characterise the input digital data stream,
      a signal generator for generating an RF carrier signal with a phase property defined by the generated digital phase signal,
      an amplifier arranged to receive the RF carrier signal as an input, and
      a bi-level switching circuit comprising a first fixed electrical configuration and a second fixed electrical configuration, responsive to the generated digital amplitude signal to switch between the first electrical configuration and the second electrical configuration, for generating a voltage signal, for supplying power to the amplifier, dependent upon the electrical configuration of the bi-level switching circuit.

20. A method, comprising:
   generating from a digital data stream, in a transmitter suitable for modulating an RF carrier signal with the digital data stream, a digital phase signal and a digital amplitude signal which characterise the digital data stream;
   generating an RF carrier signal having a phase property defined by the digital phase signal;
   passing the RF carrier signal to an RF amplifier;
   causing, in response to the digital amplitude signal, a bi-level switching circuit comprising a first fixed electrical configuration and a second fixed electrical configuration, to switch between the first electrical configuration and the second electrical configuration, to generate a voltage supply signal, dependent upon the electrical configuration of the bi-level switching circuit; and
   applying the voltage supply signal to a power supply input of the amplifier.

* * * * *